(12) United States Patent
Zhang

(10) Patent No.: US 11,342,376 B2
(45) Date of Patent: May 24, 2022

(54) LIGHT EMITTING DIODE, DISPLAY SUBSTRATE AND TRANSFER METHOD

(71) Applicant: BOE Technology Group Co., Ltd., Beijing (CN)

(72) Inventor: Can Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 165 days.

(21) Appl. No.: 16/905,933

(22) Filed: Jun. 19, 2020

(65) Prior Publication Data

US 2021/0028225 A1  Jan. 28, 2021

(30) Foreign Application Priority Data

Jul. 22, 2019  (CN) .......................... 201910661924.9

(51) Int. Cl.
| | | |
|---|---|---|
| *H01L 27/15* | (2006.01) | |
| *H01L 33/40* | (2010.01) | |
| *H01L 33/62* | (2010.01) | |

(52) U.S. Cl.
CPC ............ *H01L 27/156* (2013.01); *H01L 33/40* (2013.01); *H01L 33/62* (2013.01)

(58) Field of Classification Search
CPC ....... H01L 27/156; H01L 33/40; H01L 33/62; H01L 33/0095; H01L 25/0753; H01L 33/44; H01L 21/68; H01L 21/6835; H01L 27/1218; H01L 33/48; H01L 2221/68368; H01L 2933/0033
See application file for complete search history.

(56) References Cited

U.S. PATENT DOCUMENTS

| | | | | |
|---|---|---|---|---|
| 3,959,874 A | * | 6/1976 | Coucoulas | .......... H01L 23/3121 |
| | | | | 29/856 |
| 6,734,404 B2 | | 5/2004 | Hays | |
| 10,811,567 B2 | * | 10/2020 | Lim | ........................ H01L 33/56 |
| 2008/0253085 A1 | * | 10/2008 | Soffer | ....................... G06F 1/18 |
| | | | | 361/679.4 |

(Continued)

FOREIGN PATENT DOCUMENTS

| | | |
|---|---|---|
| CN | 107017319 A | 8/2017 |
| CN | 109273565 A | 1/2019 |

OTHER PUBLICATIONS

Office Action dated Mar. 11, 2020 for Chinese Patent Application No. 201910661924.9 and English Translation.

*Primary Examiner* — Victor A Mandala
(74) *Attorney, Agent, or Firm* — Ling Wu; Stephen Yang; Ling and Yang Intellectual Property

(57) ABSTRACT

Provided are a light emitting diode, a display substrate and a transfer method. The transfer method includes: preparing a transfer substrate and the display substrate respectively, wherein the transfer substrate includes a plurality of light emitting diodes arranged in a matrix; aligning the transfer substrate with the display substrate, wherein first magnetic layers of the light emitting diodes on the transfer substrate correspond to second magnetic layers of the sub-pixels on the display substrate one by one; and driving the transfer substrate to approach the display substrate, so that the light emitting diodes on the transfer substrate are positioned to fall onto the sub-pixels of the display substrate by action of magnetic attraction forces generated by the first magnetic layers and the second magnetic layers.

20 Claims, 2 Drawing Sheets

(56) References Cited

U.S. PATENT DOCUMENTS

| | | | |
|---|---|---|---|
| 2013/0134470 A1* | 5/2013 | Shin | H01L 33/62 257/99 |
| 2015/0048520 A1* | 2/2015 | Skinner | H01L 23/32 257/777 |
| 2015/0130075 A1* | 5/2015 | Ji | H01L 23/562 257/774 |
| 2017/0047495 A1* | 2/2017 | Shur | H01L 33/32 |
| 2017/0148771 A1* | 5/2017 | Cha | H05K 3/325 |
| 2017/0154919 A1* | 6/2017 | Chen | H01L 21/6835 |
| 2018/0033773 A1* | 2/2018 | Huang | H01L 25/50 |
| 2020/0303359 A1* | 9/2020 | Robin | H01L 24/08 |
| 2020/0411739 A1* | 12/2020 | Wu | H01L 25/0753 |
| 2021/0002087 A1* | 1/2021 | Chen | H01L 25/0753 |
| 2021/0057607 A1* | 2/2021 | Lin | H01L 33/0095 |
| 2021/0136966 A1* | 5/2021 | Jang | H05K 13/02 |
| 2021/0202799 A1* | 7/2021 | Ge | H01L 33/005 |

\* cited by examiner

S1 — A transfer substrate and a display substrate are respectively prepared, wherein the transfer substrate includes a plurality of light emitting diodes arranged in a matrix, and the display substrate includes a plurality of sub-pixels arranged in a matrix S2 — The transfer substrate is aligned with the display substrate, wherein first magnetic layers of the light emitting diodes on the transfer substrate correspond to second magnetic layers of the sub-pixels on the display substrate one by one S3 — The transfer substrate is driven to approach the display substrate, so that the light emitting diodes each on the transfer substrate are positioned to fall onto the sub-pixels each of the display substrate under action of magnetic attraction forces generated by the first magnetic layers and the second magnetic layers

FIG. 1

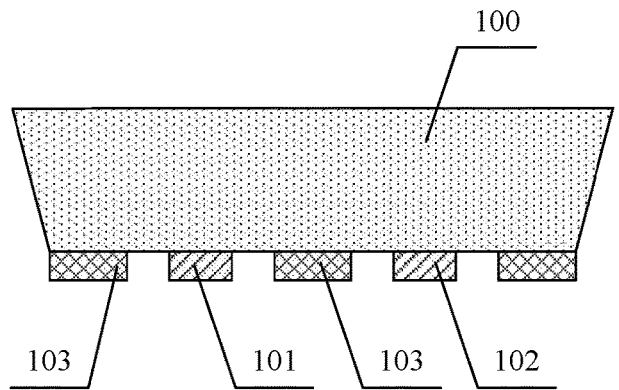

FIG. 2

LIGHT EMITTING DIODE, DISPLAY SUBSTRATE AND TRANSFER METHOD

CROSS-REFERENCE TO RELATED APPLICATION

The present application claims the priority of Chinese Patent Application No. 201910661924.9 filed to the CNIPA on Jul. 22, 2019, the content of which is hereby incorporated by reference.

TECHNICAL FIELD

The present disclosure relates to, but is not limited to, the technical field of display, in particular to a light emitting diode, a display substrate and a transfer method.

BACKGROUND

Light Emitting Diode (LED) technology has developed for nearly 30 years, from the initial solid-state lighting power supply to backlight source in the display field, and then to the LED display screen. The development of the LED technology provides a solid foundation for its wide applications. With development of chip manufacturing and encapsulation technology, Mini Light Emitting Diode (Mini LED) display of about 50 microns to 60 microns and Micro Light Emitting Diode (Micro LED) display of less than 15 microns have gradually become a hot spot in the display panel. The Micro LED display has obvious advantages of low power consumption, high color gamut, ultra-high resolution, ultra-thin, etc., and is expected to become a better display technology to replace Organic Light Emitting Diode (OLED) display.

SUMMARY

The following is a summary of a subject matter described in detail herein. This summary is not intended to limit the protection scope of the claims.

Provided is a light emitting diode, including an emitting structure layer, and a first electrode bonding pad, a second electrode bonding pad and a first magnetic layer which are disposed on the emitting structure layer. The first electrode bonding pad and the second electrode bonding pad are configured to be bonded to a display substrate, and the first magnetic layer is configured to generate a magnetic attraction force to a second magnetic layer of the display substrate during a transfer process, so that the light emitting diode is positioned to fall onto a sub-pixel of the display substrate under action of the magnetic attraction force. The first magnetic layer is disposed between the first electrode bonding pad and the second electrode bonding pad, on a side of the first electrode bonding pad away from the second electrode bonding pad and a side of the second electrode bonding pad away from the first electrode bonding pad, respectively.

In some possible implementations, the first magnetic layer includes a photosensitive material layer in which magnetic nano-particles are provided.

In some possible implementations, a material of the photosensitive material layer includes photoresist.

In some possible implementations, a material of a magnetic nano-particle includes any one or more of ferroferric oxide, nickel and cobalt.

In some possible implementations, a shape of a magnetic nano-particle includes a polygon.

In some possible implementations, a diameter of a magnetic nano-particle is 10 nm to 20 nm.

In some possible implementations, the first magnetic layer includes a magnetic material layer formed by a ferromagnetic metal material, and the ferromagnetic metal material includes any one or more of nickel, iron, cobalt, and alloy thereof.

In some possible implementations, a magnetic polarity of the first magnetic layer is opposite to that of the second magnetic layer.

In some possible implementations, the first electrode bonding pad is configured to be bonded to a first contact electrode of the display substrate, and the second electrode bonding pad is configured to be bonded to a second contact electrode of the display substrate.

Provided is a display substrate, including a plurality of sub-pixels arranged in a matrix. Each sub-pixel includes a driving circuit layer, and a first contact electrode, a second contact electrode and a second magnetic layer which are disposed on the driving circuit layer, the first contact electrode and the second contact electrode are configured to be bonded to a light emitting diode, the second magnetic layer is configured to generate a magnetic attraction force to a first magnetic layer of the light emitting diode during a transfer process, so that the light emitting diode is positioned to fall onto the sub-pixel of the display substrate by action of the magnetic attraction force. The second magnetic layer is disposed between the first contact electrode and the second contact electrode, on a remote side of the first contact electrode away from the second contact electrode and a remote side of the second contact electrode away from the first contact electrode.

In some possible implementations, the second magnetic layer includes a photosensitive material layer in which magnetic nano-particles are provided.

In some possible implementations, a material of the photosensitive material layer includes photoresist.

In some possible implementations, a material of a magnetic nano-particle includes any one or more of ferroferric oxide, nickel and cobalt.

In some possible implementations, a shape of a magnetic nano-particle includes a polygon.

In some possible implementations, a diameter of a magnetic nano-particle is 10 nm to 20 nm.

In some possible implementations, the second magnetic layer includes a magnetic material layer formed by a ferromagnetic metal material, and the ferromagnetic metal material includes any one or more of nickel, iron, cobalt, and alloy thereof.

In some possible implementations, the first contact electrode, the second contact electrode, and the second magnetic layer are sequentially prepared in one device by electroplating.

In some possible implementations, a magnetic polarity of the second magnetic layer is opposite to that of the first magnetic layer.

In some possible implementations, the first contact electrode is configured to be bonded to a first electrode bonding pad of the light emitting diode, and the second contact electrode is configured to be bonded to a second electrode bonding pad of the light emitting diode.

Provided is a transfer method, which is applied for transferring a plurality of light emitting diodes mentioned above onto a display substrate. The display substrate includes a plurality of sub-pixels arranged in a matrix, each sub-pixel includes a driving circuit layer, and a first contact electrode, a second contact electrode and a second magnetic layer which are disposed on the driving circuit layer, the first contact electrode and the second contact electrode are configured to be bonded to a light emitting diode, the second magnetic layer is configured to generate a magnetic attraction force to the first magnetic layer of the light emitting diode during a transfer process, so that the light emitting diode is positioned to fall onto the sub-pixel of the display substrate by action of the magnetic attraction force. The second magnetic layer is disposed between the first contact electrode and the second contact electrode, on a remote side of the first contact electrode away from the second contact electrode and a remote side of the second contact electrode away from the first contact electrode.

The transfer method includes: preparing a transfer substrate and the display substrate respectively, wherein the transfer substrate includes a plurality of light emitting diodes arranged in a matrix; aligning the transfer substrate with the display substrate, wherein first magnetic layers of the light emitting diodes on the transfer substrate correspond to second magnetic layers of the sub-pixels on the display substrate one by one; and driving the transfer substrate to approach the display substrate, so that the light emitting diodes on the transfer substrate are positioned to fall onto the sub-pixels of the display substrate by action of magnetic attraction forces generated by the first magnetic layers and the second magnetic layers.

Other aspects will become apparent upon reading and understanding the drawings and detailed description.

BRIEF DESCRIPTION OF DRAWINGS

Accompanying drawings are used for providing a further understanding of technical solutions of the present disclosure and form a part of the specification. Together with embodiments of the present application, the accompanying drawings are used for explaining technical solutions of the present disclosure and do not constitute a limitation on the technical solutions of the present disclosure. Shapes and sizes of the components in the drawings do not reflect real proportions, and are only for the purpose of schematically illustrating contents of the present disclosure.

FIG. 1 is a flowchart of a transfer method according to an exemplary embodiment of the present disclosure.

FIG. 2 is a schematic structural diagram of a Micro LED according to an exemplary embodiment of the present disclosure.

DESCRIPTION OF THE REFERENCE SIGNS

Figure 3:
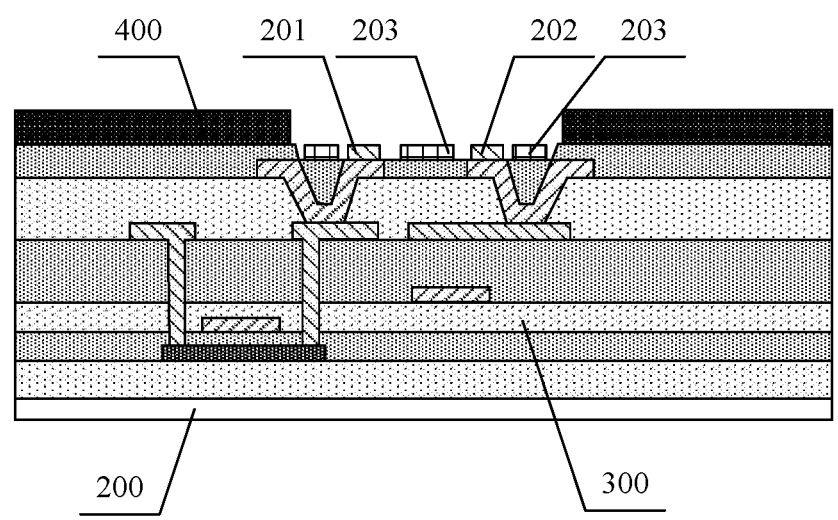
FIG. 3 is a schematic structural diagram of a display substrate according to an exemplary embodiment of the present disclosure.

100—Emitting Structure Layer;
101—First Electrode bonding Pad;
102—Second Electrode bonding Pad;
103—First Magnetic Layer;
200—Substrate;
201—First Contact Electrode;
202—Second Contact Electrode;
203—Second Magnetic Layer;
300—Driving Circuit Layer;
400—Black Matrix Layer.

DETAILED DESCRIPTION

Embodiments herein may be implemented in multiple different forms. Those with ordinary skill in the art can easily understand a fact that modes and contents for implementation can be changed in various ways without departing from the principle and scope of the present disclosure. Therefore, the present disclosure should not be construed to be limited only to what is described in the following embodiments. The embodiments in the present disclosure and the features in the embodiments may be combined with each other arbitrarily without a conflict.

One of the technical difficulties in the Micro LED display technology is a mass transfer technology, i.e., how to massively transfer Micro LEDs from an original epitaxial substrate to the display substrate. In one mass transfer approach, Micro LEDs are placed to a specified position by electrostatic adsorption or van der Waals force, and then are bonded. Due to a problem of inaccurate positioning, in the mass transfer approach not only a small amount of Micro LEDs are transferred in batches, tack time in production is increased, but also a problem of short circuit occurs in the transfer process, and the yield is reduced.

FIG. 1 is a flowchart of a transfer method according to an exemplary embodiment of the present disclosure. As shown in FIG. 1, in an exemplary embodiment, the transfer method includes the following acts S1-S3.

In S1, a transfer substrate and a display substrate are respectively prepared, wherein the transfer substrate includes a plurality of light emitting diodes arranged in a matrix, and the display substrate includes a plurality of sub-pixels arranged in a matrix.

In S2, the transfer substrate is aligned with the display substrate, wherein first magnetic layers of the light emitting diodes on the transfer substrate correspond to second magnetic layers of the sub-pixels on the display substrate one by one.

In S3, the transfer substrate is driven to approach the display substrate, so that the light emitting diodes each on the transfer substrate are positioned to fall onto the sub-pixels each of the display substrate under action of magnetic attraction forces generated by the first magnetic layers and the second magnetic layers.

According to the exemplary embodiment of the present disclosure, the first magnetic layer is disposed on the light emitting diode and the second magnetic layer is disposed in each sub-pixel of the display substrate, and in the transfer process, it is ensured that the light emitting diode is positioned to fall onto the sub-pixel of the display substrate using the magnetic attraction force generated between the first magnetic layer and the second magnetic layer, improving the positioning accuracy.

FIG. 2 is a schematic structural diagram of a Micro LED according to an exemplary embodiment of the present disclosure. In an exemplary embodiment, a first magnetic layer is disposed on the Micro LED. As shown in FIG. 2, the Micro LED includes an emitting structure layer 100, and a first electrode bonding pad 101, a second electrode bonding pad 102, and a first magnetic layer 103 which are disposed on the emitting structure layer 100. In an exemplary embodiment, the first electrode bonding pad 101 and the second electrode bonding pad 102 are configured to be bonded with a first contact electrode and a second contact electrode of the display substrate, and the first magnetic layer 103 is configured to generate a magnetic attraction force to a second magnetic layer of the display substrate during a transfer process, so that the Micro LED is positioned to fall onto a sub-pixel of the display substrate by action of the magnetic attraction force, to ensure that the first electrode bonding pad of the Micro LED contacts with the first contact electrode of the display substrate and the second electrode bonding pad of the Micro LED contacts with the second contact electrode of the display substrate. In an exemplary embodiment, the first electrode bonding pad 101 and the second electrode bonding pad 102 may be a P electrode bonding pad and an N electrode bonding pad, respectively, or may be an N electrode bonding pad and a P electrode bonding pad, respectively, and the emitting structure layer 100 may be a red emitting structure layer, a green emitting structure layer, and a blue emitting structure layer, forming a red Micro LED, a green Micro LED, and a blue Micro LED respectively.

In an exemplary embodiment, the first magnetic layer 103 may be disposed between the first electrode bonding pad 101 and the second electrode bonding pad 102, or may be disposed on a remote side of the first electrode bonding pad 101 away from the second electrode bonding pad 102, or may be disposed on a remote side of the second electrode bonding pad 102 away from the first electrode bonding pad 101, or may be disposed between the first electrode bonding pad 101 and the second electrode bonding pad 102, on the remote side of the first electrode bonding pad 101 away from the second electrode bonding pad 102 and on the remote side of the second electrode bonding pad 102 away from the first electrode bonding pad 101, simultaneously. In an exemplary embodiment, a position and size of the first magnetic layer 103 may be set according to a magnetic attraction force actually required and positions of the electrode bonding pads of the Micro LED.

In an exemplary embodiment, the first magnetic layer 103 may be a magnetic particle layer. The magnetic particle layer refers to a magnetic layer formed by adding magnetic nano-particles to a nonmetallic substrate, wherein photoresist or another photosensitive material may be adopted for the nonmetallic substrate, and the magnetic nano-particles may include any one or more of $Fe_3O_4$ particles, Ni particles, Co particles and other magnetic particles. In an exemplary embodiment, $Fe_3O_4$ particles may be prepared by a physical approach or a chemical approach, the physical approach may include vapor deposition, electron beam lithography, mechanical pulverization, etc., and the chemical approach may include deposition, $H_2$ reduction hematite, ammonia co-deposition, hydrothermal approach, and warm (solution) oxidation, etc. In an exemplary embodiment, the physical approach has defects of inaccurate particle size control and high cost and the like, and the deposition in the chemical approach is a better approach for preparing $Fe_3O_4$ particles. In the deposition, iron salt and ferrous salt are mixed into a solution in a certain proportion, and appropriate alkaline precipitant is selected for co-precipitation of the solution. By controlling a process condition, nano-sized $Fe_3O_4$ particles with excellent performance can be obtained. In an exemplary embodiment, $Fe_3O_4$ particles are polygonal bodies nearly circular, with a particle diameter of about 10 nm to 20 nm.

In an exemplary embodiment, the first magnetic layer 103 may be a magnetic material layer. The magnetic material layer refers to a magnetic layer formed by a ferromagnetic metal material, which may include any one or more of the following: nickel Ni, iron Fe, Cobalt Co and other magnetic materials and alloy thereof, such as nickel iron alloy NiFe.

In an exemplary embodiment, preparing a Micro LED may include: growing a buffer layer on a substrate, growing an N-type semiconductor layer on the buffer layer, growing multiple quantum wells on the N-type semiconductor layer, growing a P-type semiconductor layer on the multiple quantum wells, then forming a step on the N-type semiconductor layer, preparing an N electrode bonding pad on the N-type semiconductor layer, preparing a P electrode bonding pad on the P-type semiconductor layer, and then a light emitting diode is formed. Herein the N electrode bonding pad and the P electrode bonding pad are configured to be bonded to the display substrate. In an exemplary embodiment, the substrate, the buffer layer, the N-type semiconductor layer, the multiple quantum wells, and the P-type semiconductor layer together constitute an emitting structure layer, and the N electrode bonding pad and the P electrode bonding pad are connected to the emitting structure layer. In an exemplary embodiment, after the N electrode bonding pad and the P electrode bonding pad are prepared, the first magnetic layer 103 is prepared in an area other than the N electrode bonding pad and the P electrode bonding pad, and the first magnetic layer 103 is configured to generate a magnetic attraction force to a second magnetic layer of the display substrate during the transfer process, so that the Micro LED accurately falls onto a set position of the display substrate under action of the magnetic attraction force to ensure that the first electrode bonding pad of the Micro LED contacts with the first contact electrode of the display substrate and the second electrode bonding pad of the Micro LED contacts with the second contact electrode of the display substrate.

The first magnetic layer may be prepared by a patterning process when the first magnetic layer is a magnetic particle layer. In an exemplary embodiment, a solution mixed with $Fe_3O_4$ particles is first prepared, and then the solution mixed with $Fe_3O_4$ particles is mixed into photoresist. After the preparation of the emitting structure layer, the N electrode bonding pad and the P electrode bonding pad is completed, photoresist mixed with $Fe_3O_4$ particles is coated on the emitting structure layer, and a magnetic particle layer pattern is prepared at required positions through mask exposure and development (i.e., patterning). The first magnetic layer may be prepared by an electroplating process when the first magnetic layer is a magnetic material layer. In an exemplary embodiment, after the preparation of the emitting structure layer, the N electrode bonding pad and the P electrode bonding pad is completed, a magnetic material layer pattern is prepared at desired positions by electroplating. In an exemplary embodiment, the magnetic particle layer or the magnetic material layer may be prepared in other ways, and the present disclosure is not limited thereto.

In an exemplary embodiment, the first magnetic layer 103 adopts a magnetic particle layer including photoresist mixed with $Fe_3O_4$ particles, and is prepared by a patterning process. The magnetic particle layer includes a first magnetic particle block, a second magnetic particle block, and a third magnetic particle block, wherein the first magnetic particle block is located between the first electrode bonding pad 101 and the second electrode bonding pad 102, the second magnetic particle block is located on a remote side of the first electrode bonding pad 101 away from the second electrode bonding pad 102, and the third magnetic particle block is located on a remote side of the second electrode bonding pad 102 away from the first electrode bonding pad 101.

After the micro LEDs including the first magnetic layer is prepared, a plurality of the micro LEDs are arranged on the transfer substrate according to a required transfer pitch, a plurality of light emitting diodes are arranged in a matrix on the transfer substrate, and a mode of matrix arrangement of the plurality of micro LEDs is the same as that of the plurality of sub-pixels of the display substrate to form the transfer substrate. In the formed transfer substrate, in order to ensure reliable connections between the electrode bonding pads of the Micro LED and the contact electrodes of the display substrate, a distance between a surface of the first magnetic layer and the transfer substrate may be set to be less than or equal to a distance between a surface of the electrode bonding pads (the first electrode bonding pad and the second electrode bonding pad) and the transfer substrate, so that the electrode bonding pads of the Micro LED are first contacted with the contact electrodes of the display substrate when the light emitting diode falls onto the display substrate.

FIG. 3 is a schematic structural diagram of a display substrate according to an exemplary embodiment of the present disclosure. In an exemplary embodiment, a second magnetic layer is disposed on the display substrate. On a plane parallel to the display substrate, the display substrate includes a plurality of sub-pixels arranged in a matrix, and a mode of matrix arrangement of the plurality of sub-pixels is the same as that of the plurality of light emitting diodes on the transfer substrate. On a plane perpendicular to the display substrate, each sub-pixel includes a substrate 200, a driving circuit layer 300 disposed on the substrate 200, a first contact electrode 201, a second contact electrode 202, and a second magnetic layer 203 which are disposed on the driving circuit layer 300. In an exemplary embodiment, the first contact electrode 201 and the second contact electrode 202 are configured to be bonded to a first electrode bonding pad and a second electrode bonding pad of a Micro LED respectively, and the second magnetic layer 203 is configured to generate a magnetic attraction force to a first magnetic layer of the Micro LED during a transfer process, so that the Micro LED accurately falls onto a set position of the display substrate by action of the magnetic attraction force to ensure that the first electrode bonding pad of the Micro LED contacts with the first contact electrode of the display substrate and the second electrode bonding pad of the Micro LED contacts with the second contact electrode of the display substrate. In an exemplary embodiment, the first contact electrode 201 and the second contact electrode 202 may be a P contact electrode and an N contact electrode, respectively, or may be an N contact electrode and a P contact electrode, respectively, and the sub-pixels include a red sub-pixel, a green sub-pixel, and a blue sub-pixel, or include a red sub-pixel, a green sub-pixel, a blue sub-pixel, and a white sub-pixel.

In an exemplary embodiment, the second magnetic layer 203 may be disposed between the first contact electrode 201 and the second contact electrode 202, or may be disposed on a remote side of the first contact electrode 201 away from the second contact electrode 202, or may be disposed on a remote side of the second contact electrode 202 away from the first contact electrode 201, or may be disposed between the first contact electrode 201 and the second contact electrode 202, on the remote side of the first contact electrode 201 away from the second contact electrode 202 and on the remote side of the second contact electrode 202 away from the first contact electrode 201, simultaneously. In an exemplary embodiment, a position and size of the second magnetic layer 203 may be designed according to the position and size of the first magnetic layer of the Micro LED, so that the positions and sizes of the two correspond to each other.

In an exemplary embodiment, the second magnetic layer 203 may be a magnetic particle layer. In an exemplary embodiment, the second magnetic layer 203 may be a magnetic material layer. When the magnetic particle layer is adopted for the first magnetic layer of the Micro LED, the second magnetic layer 203 on the display substrate adopts the magnetic material layer, and when the magnetic particle layer is adopted for the first magnetic layer of the Micro LED, the second magnetic layer 203 on the display substrate adopts the magnetic particle layer, so that the magnetic polarities of the first magnetic layer and the second magnetic layer are opposite. The materials, structures and preparation approaches of the magnetic particle layer and the magnetic material layer have been previously described and will not be described repeatedly here.

In an exemplary embodiment, preparing a display substrate may include: preparing, on a substrate, first a driving circuit layer including a Thin Film Transistor (TFT) and a common electrode, and then preparing a first contact electrode connected to a drain electrode of the thin film transistor and a second contact electrode connected to the common electrode on the driving circuit layer. In an exemplary embodiment, after the preparation of the first contact electrode and the second contact electrode is completed, the second magnetic layer 203 is prepared in an area other than the first contact electrode and the second contact electrode, and the second magnetic layer 203 is configured to generate a magnetic attraction force to the first magnetic layer of the Micro LED during the transfer process, so that the Micro LED accurately falls onto a set position of the display substrate by action of the magnetic attraction force to ensure that the first electrode bonding pad of the Micro LED contacts with the first contact electrode of the display substrate and the second electrode bonding pad of the Micro LED contacts with the second contact electrode of the display substrate.

In an exemplary embodiment, the preparation process of the display substrate may include the following acts (1)-(12).

(1) Forming a buffer layer on a substrate 200. (2) Forming an active layer on the buffer layer through a patterning process. (3) Forming a first insulating layer covering the active layer and a first gate electrode disposed on the first insulating layer. (4) Forming a second insulating layer covering the first gate electrode and a second gate electrode disposed on the second insulating layer. (5) Forming a third insulating layer covering the second gate electrode, wherein two first vias exposing the active layer are provided on the third insulating layer. (6) Forming a source electrode, a drain electrode and a common electrode on the third insulating layer, wherein the source electrode and the drain electrode are respectively connected with the active layer through the first vias. (7) Forming a fourth insulating layer covering the source electrode, the drain electrode and the common electrode, wherein two second vias exposing the drain electrode and the common electrode are provided on the fourth insulating layer. (8) Forming a first electrode and a second electrode on the fourth insulating layer, wherein the first electrode is connected with the drain electrode through a second via, and the second electrode is connected with the common electrode through the other second via. (9) Forming a fifth insulating layer on which a third via exposing the first electrode and the second electrode is provided. In an exemplary embodiment, a structure from the buffer layer to the fifth insulating layer is referred to as the driving circuit layer 300. (10) Forming a first contact electrode 201 and a second contact electrode 202 in the third via of the fifth insulating layer, wherein the first contact electrode 201 is connected with the first electrode and the second contact electrode 202 is connected with the second electrode. (11) Preparing a second magnetic layer 203 in an area other than the first contact electrode 201 and the second contact electrode 202. (12) Forming a black matrix layer 400 exposing an area where the Micro LED needs to be mounted.

In an exemplary embodiment, the second magnetic layer 203 may adopt a magnetic material layer and may be prepared by electroplating. Since the first contact electrode 201 and the second contact electrode 202 are prepared by electroplating, the contact electrodes and the second magnetic layer may be sequentially prepared in one device, simplifying the preparation process. The second magnetic layer 203 may include a first magnetic block, a second magnetic block, and a third magnetic block. The first magnetic block may be located between the first contact electrode 201 and the second contact electrode 202, the second magnetic block may be located on a remote side of the first contact electrode 201 away from the second contact electrode 202, and the third magnetic block may be located on a remote side of the second contact electrode 202 away from the first contact electrode 201. In an exemplary embodiment, in order to ensure reliable connections between the electrode bonding pads of the Micro LED and the contact electrodes of the display substrate, a distance between a surface of the second magnetic layer and the substrate may be set to be less than or equal to a distance between a surface of the contact electrodes (the first contact electrode and the second contact electrode) and the substrate, so that the electrode bonding pads of the Micro LED are first contacted with the contact electrodes of the display substrate when the light emitting diode falls onto the display substrate.

The following is an exemplary explanation through the Micro LED transfer process.

(1) A transfer substrate and a display substrate are respectively prepared. In an exemplary embodiment, the prepared transfer substrate may include a plurality of light emitting diodes arranged in a matrix, and each light emitting diode may include an emitting structure layer, and a first electrode bonding pad, a second electrode bonding pad, and a first magnetic layer which are disposed on the emitting structure layer. The prepared display substrate may include a plurality of sub-pixels arranged in a matrix, and each sub-pixel may include a driving circuit layer, and a first contact electrode, a second contact electrode, and a second magnetic layer which are disposed on the driving circuit layer. In an exemplary embodiment, a magnetic polarity of the first magnetic layer is opposite to that of the second magnetic layer. In an exemplary embodiment, there is no timing requirement for the preparation of the transfer substrate and the preparation of the display substrate, and the two may be performed simultaneously.

(2) The transfer substrate is aligned with the display substrate. In an exemplary embodiment, the display substrate may be disposed on a bearing device, the driving circuit layer of the display substrate faces the transfer substrate above, the transfer substrate may be adsorbed and driven to move by a transfer device, and a plurality of light emitting diodes on the transfer substrate face the display substrate below, i.e., the first magnetic layers on the transfer substrate are disposed opposite to the second magnetic layers on the display substrate. The alignment is started when the transfer substrate is at a certain distance from the display substrate, positions of the plurality of light emitting diodes arranged in a matrix on the transfer substrate correspond to positions of the plurality of sub-pixels arranged in a matrix on the display substrate one by one, and in each light emitting diode and each sub-pixel corresponding one by one, a position of the first electrode bonding pad of the light emitting diode on the transfer substrate corresponds to a position of the first contact electrode of the sub-pixel on the display substrate, a position of the second electrode bonding pad of the light emitting diode on the transfer substrate corresponds to a position of the second contact electrode of the sub-pixel on the display substrate, and a position of the first magnetic layer of the light emitting diode on the transfer substrate corresponds to a position of the second magnetic layer of the sub-pixel on the display substrate.

(3) When the transfer device drives the transfer substrate to approach the display substrate gradually, because the magnetic polarities of the first magnetic layer of the light emitting diode on the transfer substrate and the second magnetic layer of the sub-pixel on the display substrate are opposite, a magnetic attraction force is generated based on a principle that opposite magnetic poles attract each other, and the magnetic attraction force gradually increases as a distance between the transfer substrate and the display substrate gradually decreases. When the transfer substrate is near to the display substrate to a certain extent, the magnetic attraction force plus a gravity of the light emitting diode is greater than a bonding force of the transfer substrate to bond the light emitting diode, so that the light emitting diode is separated from the transfer substrate and falls onto the display substrate. Due to existence of the magnetic attraction force between the first magnetic layer and the second magnetic layer, the magnetic attraction force continues to drive the first magnetic layer to approach the second magnetic layer after the light emitting diode is separated from the transfer substrate, so that when the light emitting diode falls onto the display substrate, the first magnetic layer and the second magnetic layer can still maintain good position correspondence. Good position correspondence between the first magnetic layer and the second magnetic layer means good position correspondence between the light emitting diode and the sub-pixel, so that the first electrode bonding pad of the light emitting diode and the first contact electrode of the sub-pixel achieve a good contact, and the second electrode bonding pad of the light emitting diode and the second contact electrode of the sub-pixel achieve a good contact.

According to the exemplary embodiment of the present disclosure, the first magnetic layer is disposed on the Micro LED in advance and the second magnetic layer is disposed in each sub-pixel of the display substrate in advance, in the transfer process, the Micro LED is driven to separate from the transfer substrate and fall onto the display substrate through the magnetic attraction force generated between the first magnetic layer and the second magnetic layer, and accurate falling of each Micro LED is ensured, thus improving the positioning accuracy. The improvement of positioning accuracy can not only increase an amount of Micro LEDs transferred in batches and improve the transfer efficiency, but also avoid the problem of short circuit in the transfer process, ensure transfer reliability and improve the yield. By driving the Micro LED to separate from the transfer substrate through the magnetic attraction force, the tack time in production is effectively shortened, the productivity is improved, the production cost is reduced, the craft is of low difficulty, easy to implement, and suitable for large-scale mass production of any size, shape and batch. The light emitting diode and the display substrate provided by the exemplary embodiment of the present disclosure have the advantages of good craft compatibility, simple craft, easy realization, high production efficiency, low production cost, high yield and the like.

In the description of the present disclosure, it should be understood that azimuth or positional relationships indicated by terms "middle", "upper", "lower", "front", "rear", "vertical", "horizontal", "top", "bottom", "inside", "outside" and the like is based on the azimuth or positional relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the present disclosure.

In the description of the present disclosure, it should be understood that unless otherwise clearly specified and defined, the terms "install", "connect", "link", "fix" and other terms should be broadly interpreted, for example, it may be connected fixedly or connected detachably, or integrated; it may be a mechanical connection or an electrical connection; it may be directly connected, or may be indirectly connected through an intermediary, it may be an internal connection between two elements or an interaction between two elements, unless otherwise clearly specified. Those of ordinary skilled in the art can understand the specific meanings of the above terms in the present disclosure according to specific situations.

Although embodiments of the present disclosure are described in the above, the above embodiments are described only for better understanding, rather than restricting the present disclosure. Any person skilled in the field to which the present disclosure pertains can make any modifications and variations in the forms and details of implementation without departing from the spirit and the scope disclosed in the present disclosure, but the patent protection scope of the present application should still be subject to the scope defined by the appended claims.

What I claim is:

1. A light emitting diode, comprising an emitting structure layer, and a first electrode bonding pad, a second electrode bonding pad and a first magnetic layer which are disposed on the emitting structure layer, wherein the first electrode bonding pad and the second electrode bonding pad are configured to be bonded to a display substrate, and the first magnetic layer is configured to generate a magnetic attraction force to a second magnetic layer of the display substrate during a transfer process, to enable the light emitting diode to be positioned to fall onto a sub-pixel of the display substrate by action of the magnetic attraction force; and the first magnetic layer is disposed between the first electrode bonding pad and the second electrode bonding pad, on a remote side of the first electrode bonding pad away from the second electrode bonding pad and a remote side of the second electrode bonding pad away from the first electrode bonding pad, respectively.

2. The light emitting diode according to claim 1, wherein the first magnetic layer comprises a photosensitive material layer in which magnetic nano-particles are provided.

3. The light emitting diode according to claim 2, wherein a material of the photosensitive material layer comprises photoresist.

4. The light emitting diode according to claim 2, wherein a material of a magnetic nano-particle comprises any one or more of ferroferric oxide, nickel and cobalt.

5. The light emitting diode according to claim 2, wherein a shape of a magnetic nano-particle comprises a polygon.

6. The light emitting diode according to claim 2, wherein a diameter of a magnetic nano-particle is 10 nm to 20 nm.

7. The light emitting diode according to claim 1, wherein the first magnetic layer comprises a magnetic material layer formed by a ferromagnetic metal material, and the ferromagnetic metal material comprises any one or more of nickel, iron, cobalt, and alloy thereof.

8. The light emitting diode according to claim 1, wherein a magnetic polarity of the first magnetic layer is opposite to that of the second magnetic layer.

9. The light emitting diode according to claim 1, wherein the first electrode bonding pad is configured to be bonded to a first contact electrode of the display substrate, and the second electrode bonding pad is configured to be bonded to a second contact electrode of the display substrate.

10. A transfer method, for transferring a plurality of light emitting diodes according to claim 1 onto a display substrate; wherein the display substrate comprises a plurality of sub-pixels arranged in a matrix, each sub-pixel comprises a driving circuit layer, and a first contact electrode, a second contact electrode and a second magnetic layer which are disposed on the driving circuit layer, the first contact electrode and the second contact electrode are configured to be bonded to a light emitting diode, the second magnetic layer is configured to generate a magnetic attraction force to the first magnetic layer of the light emitting diode during a transfer process, to enable the light emitting diode to be positioned to fall onto the sub-pixel of the display substrate by action of the magnetic attraction force; the second magnetic layer is disposed between the first contact electrode and the second contact electrode, on a remote side of the first contact electrode away from the second contact electrode and a remote side of the second contact electrode away from the first contact electrode; and the transfer method comprises:

preparing a transfer substrate and the display substrate respectively, wherein the transfer substrate comprises a plurality of light emitting diodes arranged in a matrix;

aligning the transfer substrate with the display substrate, wherein first magnetic layers of the light emitting diodes on the transfer substrate correspond to second magnetic layers of the sub-pixels on the display substrate one by one; and driving the transfer substrate to approach the display substrate, to enable the light emitting diodes on the transfer substrate to be positioned to fall onto the sub-pixels of the display substrate by action of magnetic attraction forces generated by the first magnetic layers and the second magnetic layers.

11. A display substrate, comprising a plurality of sub-pixels arranged in a matrix, wherein each sub-pixel comprises a driving circuit layer, and a first contact electrode, a second contact electrode and a second magnetic layer which are disposed on the driving circuit layer, the first contact electrode and the second contact electrode are configured to be bonded to a light emitting diode, the second magnetic layer is configured to generate a magnetic attraction force to a first magnetic layer of the light emitting diode during a transfer process, to enable the light emitting diode to be positioned to fall onto the sub-pixel of the display substrate by action of the magnetic attraction force; the second magnetic layer is disposed between the first contact electrode and the second contact electrode, on a remote side of the first contact electrode away from the second contact electrode and a remote side of the second contact electrode away from the first contact electrode.

12. The display substrate according to claim 11, wherein the second magnetic layer comprises a photosensitive material layer in which magnetic nano-particles are provided.

13. The display substrate according to claim 12, wherein a material of the photosensitive material layer comprises photoresist.

14. The display substrate according to claim 12, wherein a material of a magnetic nano-particle comprises any one or more of ferroferric oxide, nickel and cobalt.

15. The display substrate according to claim 12, wherein a shape of a magnetic nano-particle comprises a polygon.

16. The display substrate according to claim 12, wherein a diameter of a magnetic nano-particle is 10 nm to 20 nm.

17. The display substrate according to claim 11, wherein the second magnetic layer comprises a magnetic material layer formed by a ferromagnetic metal material, and the ferromagnetic metal material comprises any one or more of nickel, iron, cobalt, and alloy thereof.

18. The display substrate according to claim 17, wherein the first contact electrode, the second contact electrode, and the second magnetic layer are sequentially prepared in one device by electroplating.

19. The display substrate according to claim 11, wherein a magnetic polarity of the second magnetic layer is opposite to that of the first magnetic layer.

20. The display substrate according to claim 11, wherein the first contact electrode is configured to be bonded to a first electrode bonding pad of the light emitting diode, and the second contact electrode is configured to be bonded to a second electrode bonding pad of the light emitting diode.

\* \* \* \* \*